United States Patent [19]
Ohba et al.

[11] Patent Number: 5,764,654
[45] Date of Patent: Jun. 9, 1998

[54] SEMICONDUCTOR INTEGRATED CIRCUIT DEVICE HAVING A TEST CIRCUIT

[75] Inventors: Osam Ohba, Tokyo; Makoto Yoshida, Kawasaki, both of Japan

[73] Assignee: Fujitsu Limited, Kawasaki, Japan

[21] Appl. No.: 89,635

[22] Filed: Jul. 12, 1993

Related U.S. Application Data

[63] Continuation of Ser. No. 819,665, Jan. 13, 1992, abandoned, which is a continuation of Ser. No. 387,445, Jul. 31, 1989, abandoned, which is a continuation of Ser. No. 143,285, Jan. 7, 1988, abandoned, which is a continuation of Ser. No. 760,347, Jul. 29, 1985, abandoned.

[30] Foreign Application Priority Data

Aug. 7, 1984 [JP] Japan ................... 59-165449

[51] Int. Cl.$^6$ ................... G01R 31/3177; G01R 31/3187
[52] U.S. Cl. ................... 371/221; 371/22.2; 371/22.5
[58] Field of Search ................... 371/22.1, 22.2, 371/22.5

[56] References Cited

U.S. PATENT DOCUMENTS

| | | | |
|---|---|---|---|
| 3,615,466 | 10/1971 | Sahni | 430/312 |
| 3,795,859 | 3/1974 | Benante et al. | 324/73 R |
| 3,893,088 | 7/1975 | Bell | 365/240 X |
| 3,924,144 | 12/1975 | Hadamard | 307/303 |
| 3,958,110 | 5/1976 | Hong et al. | 371/15 |
| 3,961,252 | 6/1976 | Eichelberger | 324/73 AT |
| 4,034,356 | 7/1977 | Howley et al. | 307/465 |
| 4,192,016 | 3/1980 | Taylor | 307/465 X |
| 4,196,389 | 4/1980 | Kelley et al. | 324/158 R |
| 4,366,393 | 12/1982 | Kasuya | 307/465 X |
| 4,429,388 | 1/1984 | Fukushima et al. | 371/21 |
| 4,490,812 | 12/1984 | Guterman | 307/465 X |
| 4,517,672 | 5/1985 | Pfleiderer et al. | 371/25 X |
| 4,525,714 | 6/1985 | Still et al. | 307/465 X |
| 4,594,711 | 6/1986 | Thatte | 371/224 X |
| 4,601,033 | 7/1986 | Whelan | 371/224 |
| 4,613,970 | 9/1986 | Masuda et al. | 371/25 |
| 4,749,947 | 6/1988 | Gheewala | 324/73 R |

FOREIGN PATENT DOCUMENTS

| | | |
|---|---|---|
| 0073946 | 3/1983 | European Pat. Off. |
| 01187704 | 9/1984 | European Pat. Off. |
| 48-32490 | 4/1973 | Japan |
| 58-169937 | 10/1983 | Japan |

OTHER PUBLICATIONS

Kautz, "Cellular Logic-in-Memory Arrays",IEEE Transactions on Computers, vol. C-18, No. 8, Aug. 1969, pp. 719-727.

Landgraff, R. et al., "Design of Diagnosable Iterative Arrays", IEEE Trans. on Computers, vol. C-20, No. 8, Aug. 1971, pp. 867-877.

Hayes, J. et al., "Test Point Placement to Simplify Fault Detection", IEEE Trans. on Computers, vol. C-23, No. 7, Jul. 1974, pp. 727-735.

Gardner, P., "Logic Array," IBM Technical Disclosue Bulletin, vol. 17, No. 6, Nov. 1974, pp. 1776-1778.

Bennetts, R. et al., "Recent Developments in the Theory and Practice of Testable Logic Design", Computer, Jun. 1976, pp. 47-63.

(List continued on next page.)

Primary Examiner—Stephen M. Baker
Attorney, Agent, or Firm—Staas & Halsey

[57] ABSTRACT

A semiconductor integrated circuit device having a test circuit for testing a plurality of gate cells arranged in a matrix; and connected to constitute a logic circuit. A plurality of row selection wires are provided along the gate cells in a row direction, each of the gate cells being operatively connected to a row selection wire, and a plurality of column read-out wires are provided along the gate cells in a column direction, outputs of each of the gate cells being operatively connected to column read-out wires. A row selection ring counter, operatively connected to the row selection wires, selects any of the row selection wires and any of the gate cells connected to the selected row selection wire so that a data selector and ring counter read the output of each gate cell arranged in the logic circuits through the column read-out wires.

34 Claims, 7 Drawing Sheets

OTHER PUBLICATIONS

Jadus, D. et al. "Test Pad Multiplexing", IBM Technical Disclosure Bulletin, vol. 18, No. 7, Dec. 1975, pp. 2181–2182.

Millman, J. et al., *Microelectronics*, McGraw–Hill, 987, TK 7874.M527, p. 133.

IBM Technical Disclosure Bulletin, vol. 8, No. 5, Oct. 1965, "Voltage Checking Device", by G. Canard and A. Potocki, pp. 806–807.

IEEE Journal of Solid–State Circuits, Marchand, J., "An Alterable Programmable Logic Array", vol. SC–20, No. 5, Oct. 1985, pp. 1061–1066.

Millman, J., *Microelectronics*, copyright 1979, pp. 276–286.

IBM Technical diclosure Bulletin vol. 18; No. 7, Dec. 1975, pp. 2181–2182, New York, US.

IEEE Transactions on Circuits & Systems, vol. CAS–28, No. 11 Nov. 1981, pp. 1027–1032, IEEE New York, US.

European Search Report, The Hauge, Nov. 18, 1986, EP 85 401583.

"Fault Simulation" pp. 169–172, Nikkei Electronics, 1985, 6, 3, (No. 370).

Communication Pursuant to Article 101(12) and Rule 58(1) to (4) EPC, dated Mar. 26, 1993.

Revocation of the European Patent Pursuant to ART. 102(1) or ART. 102(3) EPC, dated Jan. 24, 1994.

VLSI: New Architectural Horizons, COMPCON 80, Feb. 25–28, 1980, Twentieth IEEE Computer Society International Conference, CA, "Testing VLSI with Random Access Scan", Hisahige Ando, pp. 50–52.

Reprinted from Proceedings of the IEEE, vol. 71, No. 1, Jan. 1983, IEEE, "Design for Testability–A Survey", Thomas W. Williams et al., pp. 311–388.

1983 IEEE, "Design for Testability in the Amdahl 580", Kenneth D. Wagner, pp. 384–388.

Integrated Electronics, *McGraw–Hill*, Millman-Halkias, "Transistor Characteristics", pp. 138–139; Field Effect Transistors, pp. 322–323; Digital Systems, pp. 632–637.

IBM Technical Disclosure Bulletin, vol. 23, No. 8, Jan. 1981, "Kerf Testing of Embedded Structure Technologies", Kugler et al. pp. 3716–3719.

IBM Technical Disclosure Bulletin, vol. 20, No. 4, Sep. 1977, "Test Site for a Semiconductor Masterslice", Esposito et al., pp. 1418–1419.

IBM Technical Disclosure Bulletin, vol. 18, No. 4, Sep. 1975, "Test Ponts for Logic Checking", Herrell, pp. 1194–1195.

IBM Technical Disclosure Bulletin, vol. 28, No. 4, Sep. 1985, "Generalized Scan Test Technique For VLSI Circuits", pp. 1600–1604.

SEMICONDUCTOR INTEGRATED CIRCUIT DEVICE HAVING A TEST CIRCUIT

This application is a continuation of application Ser. No. 07/819,665, filed Jan. 13, 1992, now abandoned, which is a continuation of application Ser. No. 07/387,445, filed Jul. 31, 1989 abandoned, which is a continuation of application Ser. No. 07/143,285, filed Jan. 7, 1988 abandoned, and which is a continuation of application Ser. No. 06/760,347, filed Jul. 29, 1985, abandoned.

BACKGROUND OF THE INVENTION

1. Field of the Invention

The present invention relates to a semiconductor integrated circuit device having a test circuit, particularly, to a gate array type large-scale integrated circuit (gate array LSI) having an improved test circuit. The gate array LSI according to the present invention can be easily tested for the operation of the logic circuit constituted by the gate cells.

2. Description of the Related Art

An LSI logic device with a test circuit was proposed in Japanese Unexamined Patent Publication (Kokai) No. 48-32490. This publication discloses row wirings and column wirings for detecting whether each unconnected gate operates properly. After finding faulty gate cells and proper gate cells, only the proper gate cells are connected to form the overall logic circuit. At the same time, the row or column wirings are fixed to the power supply voltage so that they do not affect the real logic function. Therefore, this test circuit cannot be used for testing the final logic function of the final device.

Recent research in the field of LSI testing has concentrated on the design of more effective test patterns using computer-aided-design (CAD) fault simulation and the design of more effective, simpler test circuits for incorporation in LSI's to allow testing by the scan pass method.

Testing by test patterns using CAD fault simulation, however, is disadvantageous in view of the long time required for the fault simulation program to complete; an amount of time which increases along with the increasingly greater scale of LSI's.

Testing by incorporation of test circuits and the scan pass method is therefore more preferable. One of the better known of the scan pass methods now in use is the level sensitive scan design (LSSD) method of IBM Corporation. Specifically, the logic circuit in the LSI is divided into combinational circuit portions and flip-flop circuit portions. The flip-flop circuits can be connected in series through switching circuits provided in those flip-flop circuits and as connected, the flip-flop circuits constitute a shift register. The test of the circuit is performed by switching between a "shift mode" and "normal mode". In the shift mode, a scan signal is input to the shift register. In other words, data is applied to the shift register to set up the flip-flop circuits as a predetermined "1" or "0". The flip-flop circuits are then disconnected by the switching circuits and returned to the logic circuit. A predetermined logic operation is performed, then the flip-flop circuits are reconnected to form the shift register, after which the data of the shift register is read out and checked.

The above method has some problems, however. For example, it requires that the LSI be designed to allow formation of a shift register by the flip-flop circuits, and an excessive number of signal lines must be provided to allow different types of LSI's to be checked. Also, it is only possible to test the flip-flop circuits, i.e., it is not possible to check the basic gate cells constituting the logic gates and the flip-flop gates in the logic circuit. Finally, this method requires a change in the design of the test circuit and its wiring for each different type of LSI.

SUMMARY OF THE INVENTION

The primary object of the present invention is to provide a semiconductor integrated circuit device having an improved test circuit.

Another object of the present invention is to provide a gate array type LSI having an improved test circuit enabling easy testing of the operation of the logic circuit.

In accordance with the present invention, since the gate array has plural gate cells in the matrix, the row selection wires and the column read-out wires are prepared along the gate cells' array as the master pattern. After designing the connecting wires between the gate cells according to a customer's logic data, a final logic device is produced. In order to test the final device, the test circuit is used for checking the condition of every gate cell during the logic operation.

A semiconductor integrated circuit device having a test circuit according to the present invention, includes: a plurality of gate cells arranged in a matrix; wiring for connecting the gate cells so as to constitute a logic circuit; a plurality of row selection wires provided along the gate cells in a row direction, each of the gate cells being operatively connected to a row selection wire; a plurality of column read-out wires provided along the gate cells in a column direction, outputs of each of the gate cells being operatively connected to column read-out wires; row selection means, operatively connected to said row selection wires, for selecting any of the row selection wires and for selecting any of the gate cells connected to the selected row selection wire; and output means for reading out the gate cells arranged in the logic circuit through a column read-out wire.

DESCRIPTION OF THE PREFERRED EMBODIMENTS

A semiconductor integrated circuit device according to the present invention will be explained in detail hereinafter.

Figure 1:
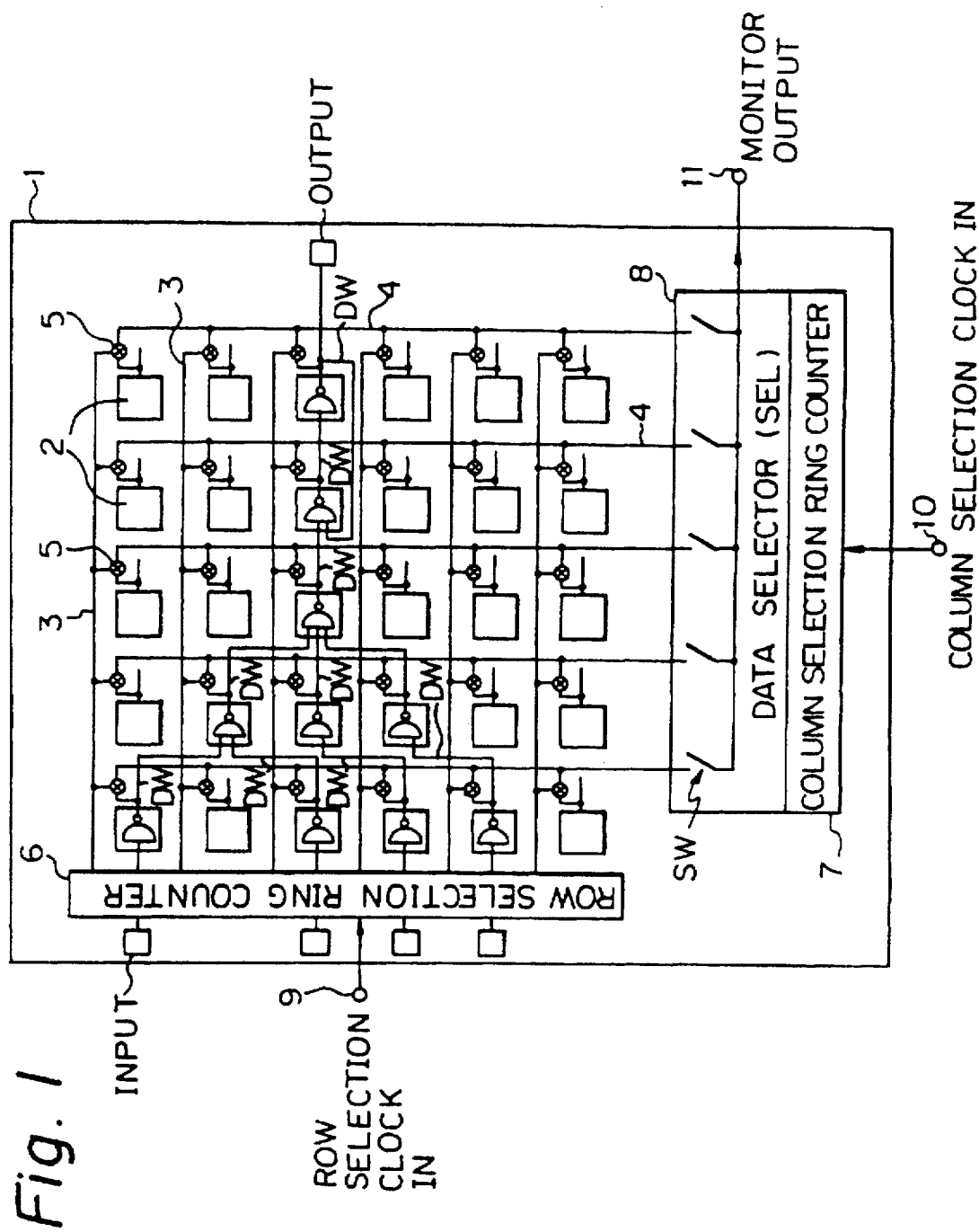
FIG. 1 is a schematic view of a semiconductor integrated circuit device according to an embodiment of the present invention.
Figure 7:
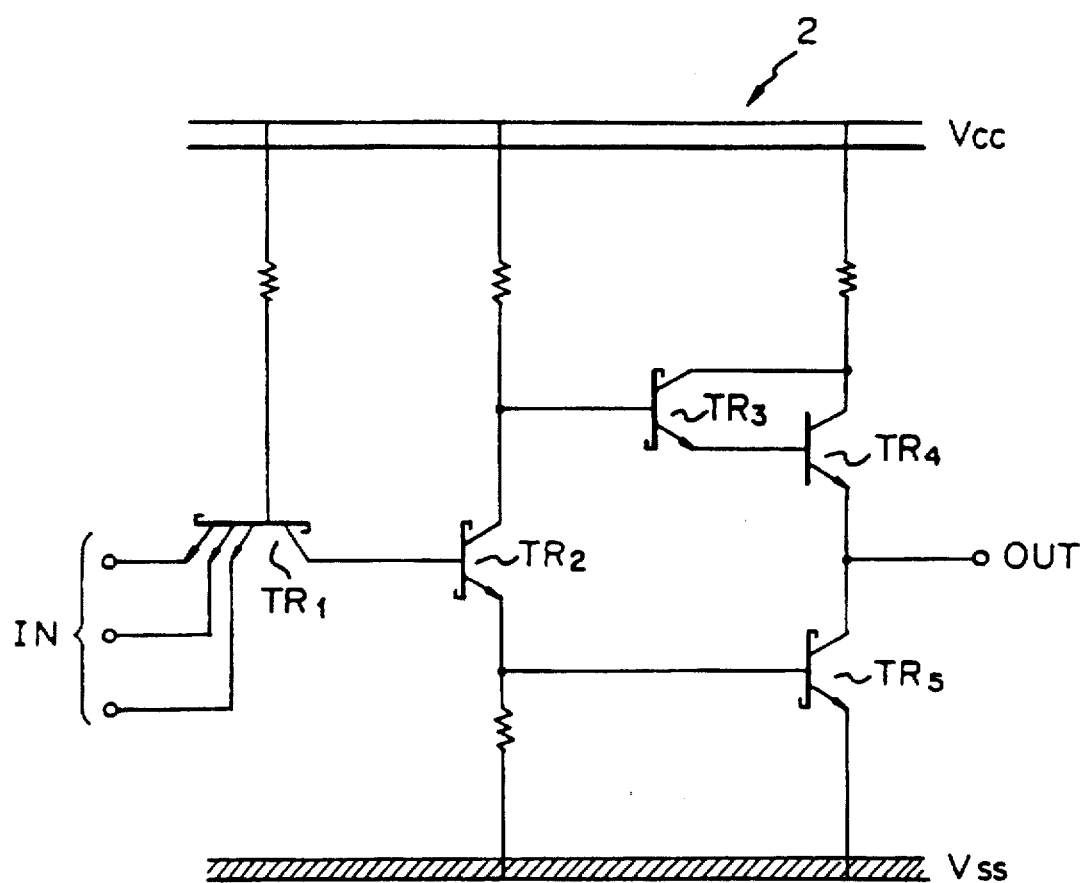
FIG. 7 shows the circuit of a gate cell shown in FIG. 1.

FIG. 1 is a schematic view of a semiconductor integrated circuit device according to an embodiment of the present invention. In FIG. 1, reference numeral 1 represents a gate array type LSI. LSI 1 includes a plurality of basic gate cells 2, arranged in a matrix and a test circuit. The test circuit comprises a plurality of row selection wires 3, a plurality of column read-out wires 4, a plurality of switches 5, a row selection ring counter 6, a column selection ring counter 7, and a data selector (SEL) 8. Each of the gate cells 2 includes, for example, a transistor-transistor logic (TTL) NAND circuit, as shown in FIG. 7. The gate cells 2 are connected by wirings DW to constitute a logic circuit based on customer requirements, for example, as shown in FIG. 1. The data is input to the "INPUT" terminal, and a logic output is obtained from the "OUTPUT" terminal.

Figure 2A:
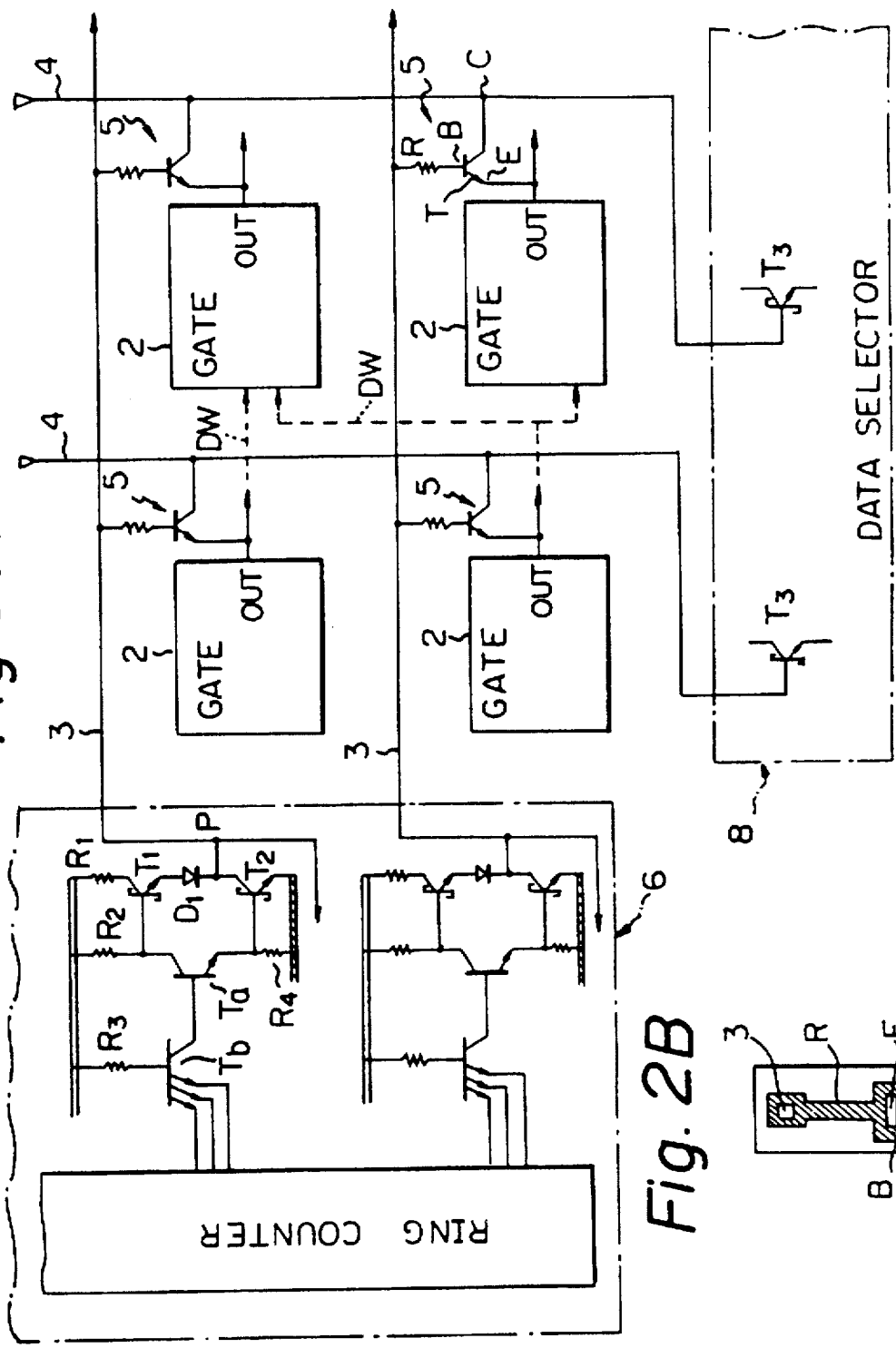
FIG. 2A shows the circuit of switches and an output stage of a row selection ring counter shown in FIG. 1.

Each row selection wire 3 is provided along a row of gate cells in the row direction, and each column read-out wire 4 is provided along a column of gate cells in the column direction. A switch 5 is provided at each intersection of the wires 3 and 4, so that the output of the corresponding gate cell 2 is connected to a column read-out wire 4 through the switch 5. The detailed structure of the switch 5 is shown in FIG. 2A.

The row selection ring counter 6 operates to sequentially select the row selection wires 3. A row selection clock signal is input to the input terminal 9. Similarly, the column selection ring counter 7 operates to sequentially select column read-out wires 4. The column selection clock signal is input to the input terminal 10. These ring counters 6 and 7 are mainly constituted by a plurality of flip-flop circuits, as shown in detail in FIGS. 5A and 5B.

The column selection ring counter 7 and the data selector 8 constitute an output means. The data selector 8 is a type of multiplexer having a plurality of switch circuits SW, as shown in detail in FIG. 3. A column read-out wire 4 is selected by the column selection ring counter 7 and the selected switch circuit SW in the data selector 8 is turned on. Accordingly, the data of the selected gate cell 2 is output to the monitor output terminal 11 through the switch 5 at the intersection of the corresponding wires 3 and 4 and the switch circuit SW in the data selector 8.

As shown in FIG. 1, only three external input and output pins are added to the LSI 1 for testing the logic circuit. That is, the input terminal pin 9 is provided to the ring counter 6 for inputting the row selection clock, the input terminal pin 10 to the ring counter 7 for inputting the column selection clock, and the monitor output terminal pin 11 to the data selector 8 for outputting the read-out data.

In the gate array design process, a master bulk is produced in advance so as to shorten the real production time from receiving the customer's logic data to producing the final device and to reduce the production costs. Further, some part of the mask pattern of the wiring is also fixed in advance. Only the remaining part of the wiring mask pattern is altered based on the customer's design data (logic data).

Now, turning back to FIG. 1, the custom designed portion of LSI 1 is the wiring patterns DW which connect the basic gate cells 2 so as to constitute the logic circuit. This custom designed portion is the above remaining part of the wiring mask pattern. The other portion including the test circuits is prepared before designing the custom designed wirings DW.

In the present invention, these prepared test circuits are constructed so as to be used after producing the actual device in which the designed wirings DW of the customer's logic data are formed on the prepared bulk. In the ordinary operation period of the logic circuit, all outputs of the row selection ring counter 6 are low level (non-selection level). Therefore, all switches 5 are turned OFF so as not to influence the operation of the logic circuit. That is, in the present invention, the row and column selection means, which corresponds to the row and column selection ring counters 6 and 7 function in a test mode and a non-test mode, which modes are selectively switched.

The operation of the test circuit will now be explained. With every input of a row selection clock pulse to the row selection ring counter 6, the output "1" in the ring counter 6 is shifted, as shown in FIG. 5C, to another row selection wire 3, which is selected corresponding to the output of the ring counter 6 which has a high level "1". Accordingly, row selection wires 3 are sequentially selected by the output "1" of the ring counter 6. When a row selection wire 3 is selected, all switches 5 connected to the row selection wire 3 are turned ON. When a switch 5 is turned ON, the output data of the gate cell 2 appears on the column read-out wire 4. The column selection ring counter 7 selects one of the column read-out wires 4. The corresponding switch circuit SW in the data selector 8 is turned ON when an output of the ring counter 7 becomes a high level "1". The output data of the gate cell 2 is output to the monitor output terminal 11 through the selected column read-out wire 4.

Accordingly, when a row selection wire 3 is fixed to the high level "1", all gate cells along the selected row selection wire 3 can be sequentially checked at the monitor output terminal 11 through the column read-out wire 4. Conversely, when a switch circuit SW in the data selector 8 is ON, all gate cells along the selected column read-out wire 4 can be sequentially checked by sequentially selecting the row selection wires 3. Furthermore, by setting or fixing, both the ring counters 6 and 7, just the output of a specific gate cell 2 can be read out, clock by clock, during the original whole logic circuit operation. This means that a specific gate cell can be monitored in real time during the logic circuit operation.

FIG. 2A shows in detail the circuit of a switch 5 and an output stage of the row selection ring counter 6. A switch 5 is constituted by two elements, for example, an n-p-n transistor T and a resistor R. The resistor R is connected between a row selection wire 3 and the base of the transistor T. The emitter E of the transistor T is connected to the output of the gate cell 2 and the collector C is connected to a column read-out wire 4.

Figure 2B:
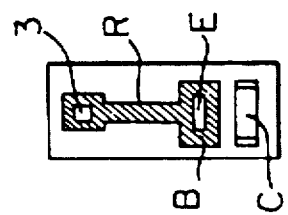
FIG. 2B is a schematic structural view of a switch shown in FIG. 2A.

In this case, as shown in FIG. 2B, the resistor R is formed by extending the base diffusion area B of the transistor T. Thus, the switch 5 actually comprises one element. In the drawings, E represents an emitter area, B a base area, and C a collector area.

The output stage of the row selection ring counter 6, shown in FIG. 2A, includes transistors ($T_1$, $T_2$, $T_a$, and $T_b$), resistors ($R_1$ to $R_4$), and a diode $D_1$. In this case, the transistors Ta and Tb are Schottky barrier transistors. An output stage is provided for every row selection wire 3. When the transistor $T_1$ is turned ON, the output point P is at a high level "1" and the row selection wire 3 becomes selected. When the transistor $T_2$ is turned ON, the output point P is at a low level "0" and the row selection wire 3 becomes non-selected.

When a row selection wire 3 is non-selected, i.e., at a low level, the transistor T of switch 5 is turned OFF regardless of the output level of the gate cell 2. On the other hand, when a row selection wire 3 is selected, i.e., at a high level, the base of the transistor T in the switch 5 becomes high and the transistor T is turned ON or OFF according to the output level of the gate cell 2. Accordingly, the output data of the gate cell 2 appears on the column read-out wire 4 through the transistor T.

Figure 3:
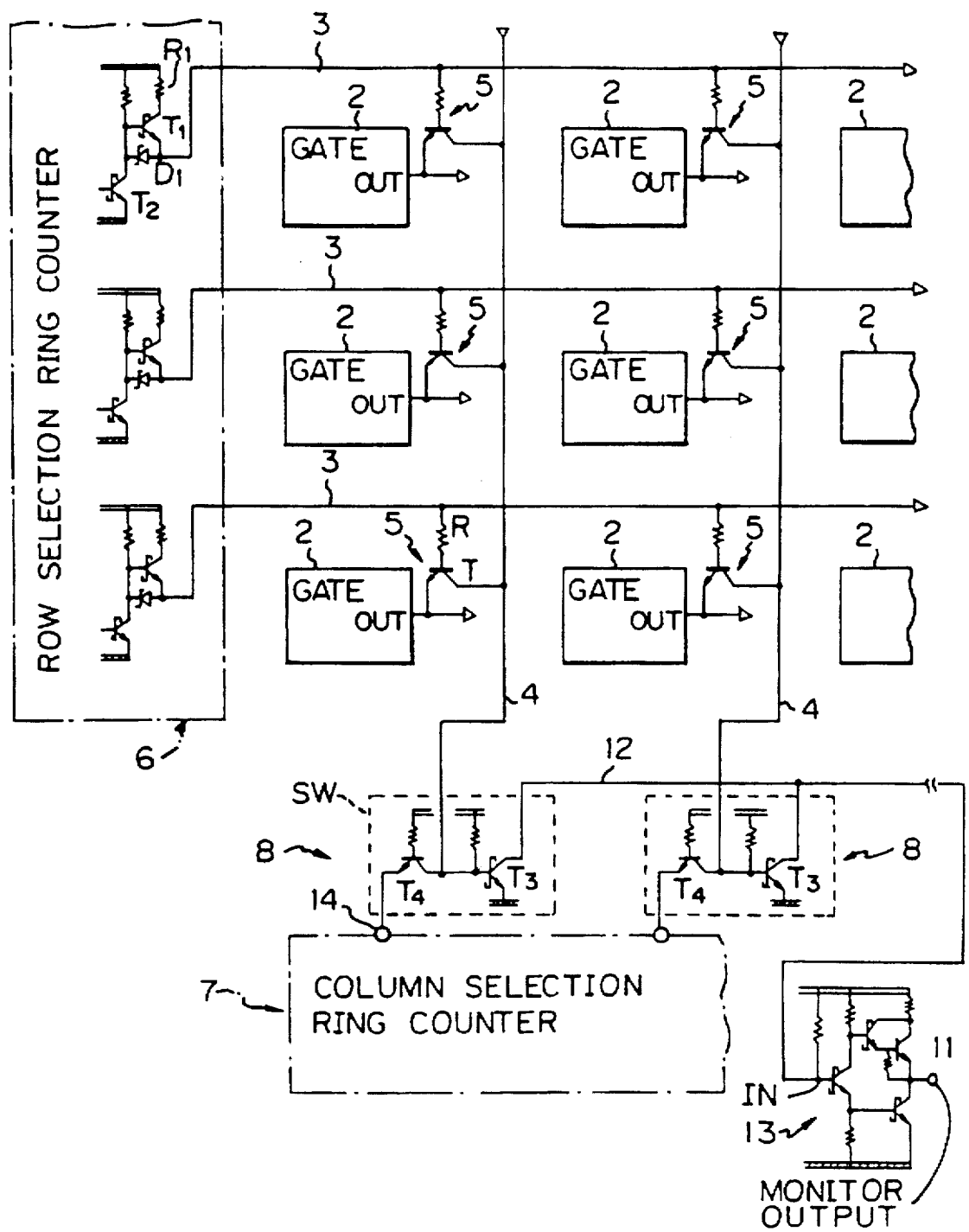
FIG. 3 shows switching circuits of a data selector shown in FIG. 1.

FIG. 3 shows, in detail, the switching circuits SW of the data selector 8. A switching circuit SW is provided at the end of each column read-out wire 4. Each switching circuit SW comprises two transistors $T_3$, $T_4$ and two resistors. All collectors of the transistors $T_3$ are connected to the input terminal IN of an output buffer 13 through a common data wire 12. The transistor $T_4$ is connected between the base of the transistor $T_3$ and the output terminal 14 of the ring counter 7. The transistors $T_3$, $T_4$ of switching circuit SW constitute a NAND gate circuit with the transistor T of the switch 5. When the output terminal 14 is low (non-selected state), the transistor $T_4$ is turned ON and the transistor $T_3$ is turned OFF. When the output terminal 14 is high (selected state), the transistor $T_4$ is turned OFF and the transistor $T_3$ is turned ON or OFF depending on the "1" or "0" of the output data of the gate cell 2 transmitted through the transistor T of the switch 5. That is, when the output of the gate cell 2 is high, the transistor $T_3$ is turned ON. Conversely, when the output of the gate cell 2 is low, the transistor $T_3$ is turned OFF. Accordingly, when the transistor $T_3$ is turned ON, a low level signal appears on the data wire 12. When the transistor $T_3$ is turned OFF, a high level signal appears on the data wire 12. The output buffer 13 outputs a low or high level signal at the monitor output 11 corresponding to the high or low level of the data wire 12.

Consequently, the operation of the logic circuit 1 shown in FIG. 1 can be checked by the output of the monitor terminal 11. That is, the output of the gate cell 2 at each intersection is sequentially checked to see if it is the expected value (designed value). If it is, the logic circuit of the previous stage of the checked gate cell is operating correctly. Accordingly, the entire logic circuit 1 can be tested by checking sequentially each output of the gate cells 2 at the monitor terminal 11. Also, if both the selection ring counters 6 and 7 are fixed, a specific gate cell output can be monitored during the logic circuit operation so that the logic level of the predetermined point of the entire logic circuit can be monitored in real time.

Figure 4:
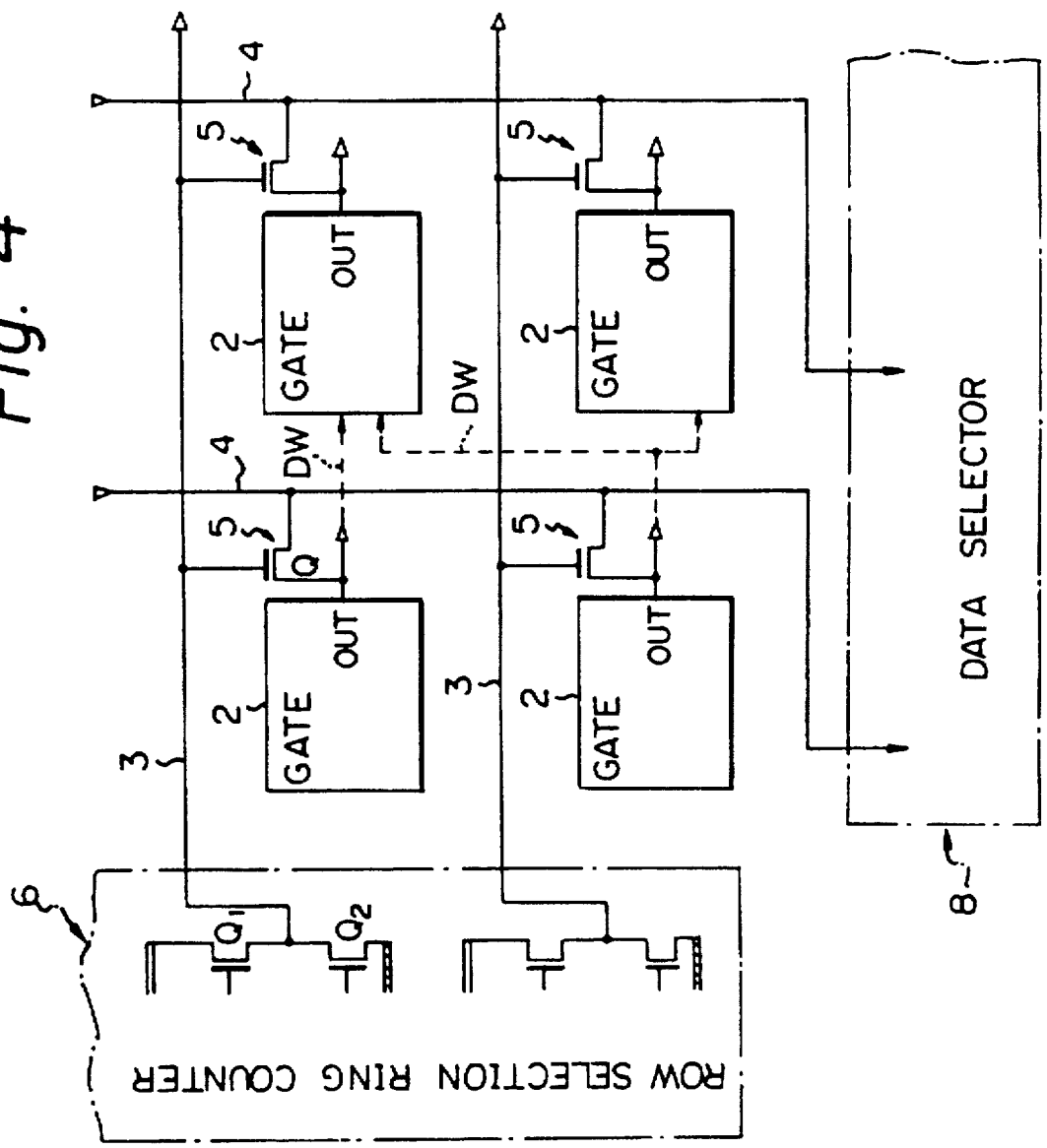
FIG. 4 shows the circuit of switches and a row selection ring counter according to another embodiment of the present invention.

FIG. 4 shows detailed circuits of the switch and the row selection ring counter 6 according to another embodiment. In this embodiment, the switch 5 is constituted by one element, i.e., a metal-oxide semiconductor (MOS) type transistor Q. Each output stage of the row selection ring counter 6 is constituted by a complementary MOS (CMOS) type inverter having MOS transistors $Q_1$ and $Q_2$ instead of the two transistors $T_1$, $T_2$ and the diode $D_1$ and the resistor $R_1$ shown in FIG. 2A. The circuit structure of this embodiment is simpler than the first embodiment.

Figure 5A:
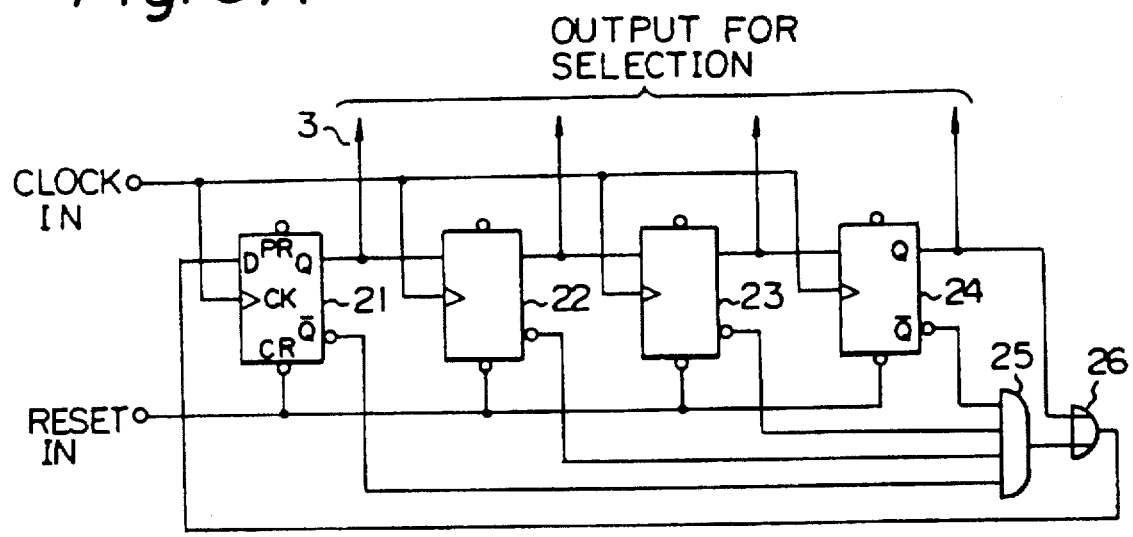
FIGS. 5A and 5B show the circuits of the row and column selection ring counters shown in FIG. 1.
Figure 5B:
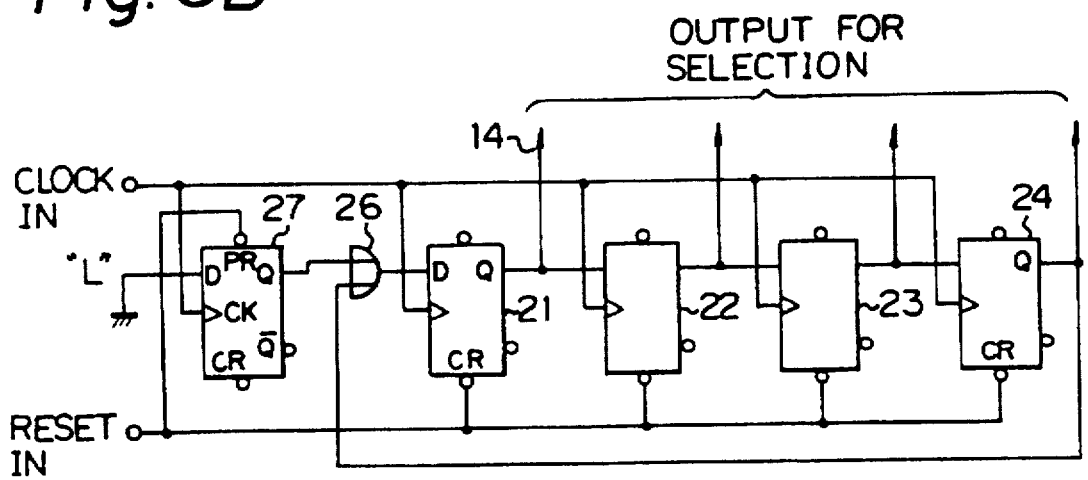
Figure 5C:
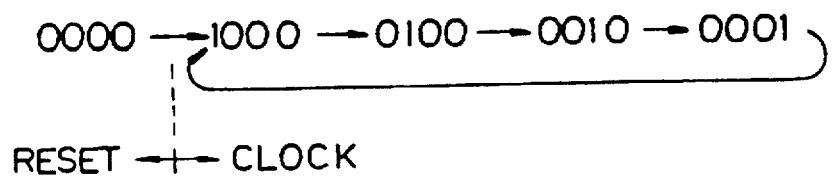
FIG. 5C is a schematic diagram for explaining the operation of the ring counters shown in FIGS. 5A and 5B.

FIGS. 5A and 5B show in detail the circuits of the row and column selection ring counters 6 and 7. In FIG. 5A, reference numerals 21 to 24 represent D type flip-flop circuits, 25 an AND gate, and 26 an OR gate. The D type flip-flop circuits 21 to 24 are connected in series through the Q outputs. As can be understood, the Q outputs correspond to the outputs of the output stages of the ring counter 6 or 7 shown in FIGS. 2A and 4. The selection of the row or the selection of the column is performed according to the high or low level of the Q outputs.

The data of the Q output of the final-stage flip-flop circuit 24 is fed back to the D input of the first-stage flip-flop circuit through the OR gate 26. Inverted data of the Q outputs ($\overline{Q}$) are also input to the D input of the flip-flop circuit 21 through the AND gate 25 and the OR gate 26. These flip-flop circuits 21 to 24 are driven by a common clock signal (reset signal mentioned above) input to each of the CK terminals in the flip-flop circuits.

As shown in FIG. 5C, it is necessary to obtain an all "0" Q output state at the beginning. To obtain an all "0" state, a reset signal is commonly input to the clear terminals CR in the flip-flop circuits. When all Q outputs are "0", all $\overline{Q}$ outputs become "1". Accordingly, the AND gate 25 outputs "1", the OR gate outputs "1", and this output "1" is fed back to the D input of the flip-flop circuit 21. In this state, when the next clock signal is input, since the Q output of the first-stage flip-flop circuit 21 becomes "1" and the $\overline{Q}$ output becomes "0", the output of the AND gate 25 becomes "0". At this point, since all Q outputs of the flip-flop circuits 22 to 24 maintain the "0" state, the output state of the ring counter becomes "1,0,0,0", as shown in FIG. 5C. The Q output "1" is shifted toward the right with each sequential clock signal.

As obvious from FIG. 5C, the ring counter becomes "0" whenever the reset signal is input and restarts from the output "1,0,0,0" by the next clock signal. The output of the ring counter circulates between "1,0,0,0" and "0,0,0,1" until the next reset signal is input. The condition in which all Q outputs become the "0" state means a non-test mode, which does not affect the normal logic function of the gate array logic circuit. The condition in which any one of the Q outputs is the "1" state means a test mode which selects one row selection wire or column read-out wire.

FIG. 5B shows another embodiment of the ring counter. In this embodiment, the flip-flop circuit 27 is provided at the input portion to generate "1" instead of the AND gate 25. At the beginning, all Q outputs of the flip-flop circuits 21 to 24 are set to "0" by the reset signal. At the same time, the flip-flop circuit 27 is preset to "1". This preset signal "1" is applied to the D input of the flip-flop circuit 21 through the OR gate 26. When the next clock signal is input, the Q output of the flip-flop 27 returns to "0" by the D input level, which is fixed to low level "L". The same operation as explained in FIG. 5A is performed until the next reset signal is input.

Figure 6:
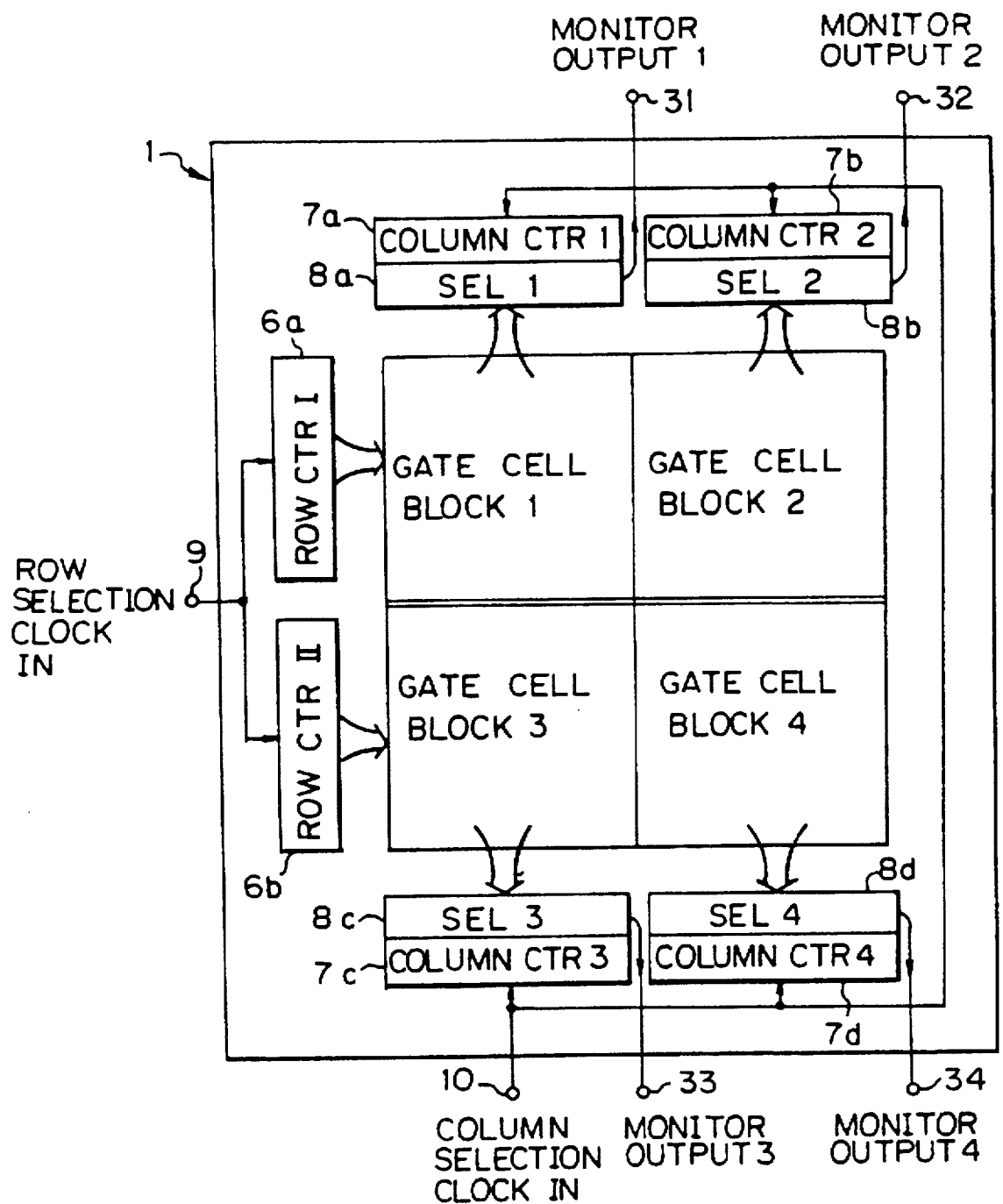
FIG. 6 is a schematic view of a semiconductor integrated circuit device according to another embodiment of the present invention.

FIG. 6 is a schematic view of a semiconductor integrated circuit device according to another embodiment of the present invention. In this embodiment, all gate cells 2 are divided into, for example, four blocks 1 to 4. In this case, a row selection ring counter (ROW CTR I) 6a is provided for the upper half portion and the row selection ring counter (ROW CTR II) 6b for the lower half portion. A column selection ring counter and data selector are provided for each of blocks 1 to 4. That is, a column selection ring counter (COLUMN CTR 1) 7a and data selector (SEL 1) 8a are provided for the lock 1, a column selection ring counter (COLUMN CTR 2) 7b and data selector (SEL 2) 8b for block 2, a column selection ring counter (COLUMN CTR 3) 7c and data selector (SEL 3) 8c for block 3, and a column selection ring counter (COLUMN CTR 4) 7d and data selector (SEL 4) 8d for block 4. In this case, the necessary time for scanning all gate cells is shortened to a quarter compared with the first embodiment shown in FIG. 1, because the number of clocks for the row and column selection is reduced to half. However, an external output pin is provided for each monitor output. These monitor output pins are shown by reference numerals 31 to 34.

Moreover, although the column selection ring counter 7 and the data selector 8 are used as the output means for selecting column read-out wires 4 in these embodiments, the output means can be replaced with a shift register which has the same number of bits as the number of column read-out wires. That is, a parallel-in/serial-out type shift register may be used for such a register instead of the column selection ring counter and the data selector. In this case, the sequential monitor output can be obtained from the shift register.

FIG. 7 shows, in detail, the circuit of the gate cell 2. This circuit is a typical three-input TTL-NAND gate circuit. In FIG. 7, $TR_1$ is a multi-emitter transistor. A low or high input signal is input to each of the emitters. $TR_2$ is a phase splitter transistor, and $TR_4$ and $TR_5$ are output transistors. A Darlington connection is formed by the transistors $TR_3$ and $TR_4$.

In accordance with the structure of the present invention, first, it is possible to check the basic gate cells, not just the flip-flop circuits. Second, it is possible to reduce the number of external pins required for the testing because ring counters are used as row and column selection means, unlike in the conventional scan pass method, wherein an address decoder is used. Third, it is not necessary to serially scan all the flip-flop gates which construct the shift register for the test operation as in the conventional LSSD method because the rows and columns are selected by ring counters so as to access the specific gate cell directly. Finally, the test circuit does not substantially affect the logic circuit, because the test circuit is turned OFF when no gate cells are selected for checking. Moreover, it is very easy to design the logic circuit because only a switch needs to be added to each gate cell.

We claim:

1. A semiconductor integrated circuit, comprising:
 a plurality of gate cells, each having an input terminal and an output terminal, said gate cells arranged in a matrix having rows and columns;
 wiring for connecting the input and output terminals of selected ones of said gate cells to form a logic circuit; and
 a test circuit including:
  a plurality of row selection wires provided along said gate cells in the row direction and formed discretely from said wiring;
  a plurality of column read-out wires provided along said gate cells in the column direction and formed discretely from said wiring;
  a plurality of switches provided at intersections of said row selection wires and said column read-out wires and within an area where said gate cells are arranged, for connecting the output terminal of one of said gate cells to one of said column read-out wires in response to a selection of the corresponding one of said row selection wires, each of said plural switches having first, second, and third terminals, the first terminal being connected to the output terminal of one of said gate cells, the second terminal being connected to one of said row selection wires, and the third terminal being connected to one of said column read-out wires;
  a row selector, operatively connected to said row selection wires, for selecting at least one of said row selection wires; and
  a monitor output, operatively connected to said column read out wires, for reading out test signals of said gate cells arranged in said logic circuit through said column read-out wires.

2. A semiconductor integrated circuit as claimed in claim 1, wherein said row selector comprises a ring counter constituted by a plurality of flip-flop circuits.

3. A semiconductor integrated circuit as claimed in claim 1, wherein said monitor output comprises a shift register.

4. A semiconductor integrated circuit as claimed in claim 1, wherein each of said switches comprises an MOS type transistor.

5. A semiconductor integrated circuit as claimed in claim 1, wherein said logic circuit is divided into at least four blocks, each block provided with said row selector and said monitor output.

6. A semiconductor integrated circuit as claimed in claim 1, wherein said row selector provides a non-selection signal to all of said row selection wires during an ordinary operation period.

7. A semiconductor integrated circuit as claimed in claim 1, wherein said monitor output comprises a column selector and a data selector.

8. A semiconductor integrated circuit as claimed in claim 7, wherein said column selector comprises a ring counter constituted by a plurality of flip-flop circuits.

9. A semiconductor integrated circuit as claimed in claim 1, wherein each of said switches comprises an n-p-n type transistor and a resistor.

10. A semiconductor integrated circuit as claimed in claim 9, wherein said resistor is formed by extending a base diffusion area of said n-p-n type transistor.

11. A semiconductor integrated circuit having an input terminal and an output terminal, comprising:
 a plurality of gate cells arranged in a matrix having rows and columns, each gate cell having a gate input terminal and a gate output terminal;
 first connecting means for connecting the gate input terminal and gate output terminal of selected ones of said gate cells to form a testable logic circuit; and
 a test circuit, including:
  second connecting means, discrete from said first connecting means, for selectively addressing at least one of said gate cells;
  means, provided within an area where said gate cells are arranged, for selectively connecting said gate cells to said second connecting means; and
  a monitor output, coupled to said second connecting means, for reading each of said gate cells through said second connecting means, said second connecting means including:
   a plurality of row selection wires corresponding to respective ones of the rows of gate cells, each row selection wire being operatively connected to said gate cells in the corresponding row;
   a plurality of column read-out wires corresponding to respective ones of the columns of gate cells, each column read-out wire being operatively connected to outputs of each of said gate cells in the corresponding column; and
   a row selector, coupled to said row selection wires, for selecting any of said row selection wires and for selecting any of the gate cells connected to the selected row selection wire.

12. A semiconductor integrated circuit according to claim 11, wherein said selectively connecting means comprises means, responsive to the selection of a row selection wire, for connecting a column read-out wire and selected ones of the corresponding gate cells.

13. A semiconductor integrated circuit as claimed in claim 11, wherein said row selector provides a non-selection signal to all of said row selection wires during an ordinary operation period.

14. A semiconductor integrated circuit having a logic circuit, comprising:
 a plurality of cells, each having a cell input terminal, a cell output terminal and a circuit element, said cells arranged in a matrix having rows and columns;
 wiring coupling the cell output terminal of a first one of said cells to the cell input terminal of a second one of said cells so as to form the logic circuit; and a test circuit including:
- a plurality of row selection wires provided along said cells in the row direction and formed discretely from said wiring;
- a plurality of column read-out wires provided along said cells in the column direction and formed discretely from said wiring;
- a plurality of switches provided at intersections of the row selection wires and the column read-out wires and within an area where said cells are arranged, for connecting the output of one of said cells to one of said column read-out wires in response to a selection of the corresponding row selection wire, each of said switches including a MOS type transistor having first and second terminals, and a gate terminal, said first terminal being connected to the output of one of said gate cells, said gate terminal being connected to one of said row selection wires, and said third terminal being connected to one of said column read-out wires;
- a row selector, operatively connected to said row selection wires, for selecting at least one of said row selection wires by providing a selection signal to the row selection wire; and
- a monitor output, operatively connected to said column read-out wires, for reading out test signals of said cells arranged in said logic circuit through said switches and said column read-out wires.

15. A semiconductor integrated circuit as claimed in claim 14, wherein said row selector comprises driver means for supplying one of the selection signal and a non-selection signal to said row selection wires.

16. A semiconductor integrated circuit as claimed in claim 14, wherein said monitor output includes a shift register which has a number of bits corresponding to a number of said column read-out wires.

17. A semiconductor integrated circuit as claimed in claim 14, wherein said row selector provides a non-selection signal to all of said row selection wires during an ordinary operation period.

18. A semiconductor integrated circuit having a logic circuit, comprising:
- a plurality of cells, each having a cell input terminal, a cell output terminal and a circuit element, arranged in a matrix having rows and columns;
- wiring coupling the cell output terminal of a first one of said cells to the cell input terminal of a second one of said cells so as to form the logic circuit; and
- a test circuit comprising:
  - a plurality of row selection wires provided along said cells in the row direction and being formed discretely from said wiring;
  - a plurality of column read-out wires provided along said cells in the column direction and being formed discretely from said wiring;
  - a plurality of switches provided at intersections of the row selection wires and the column read-out wires and within an area where said cells are arranged, for connecting the output of one of said cells to one of said column read-out wires in response to a selection of the corresponding row selection wire, each of said switches including a bipolar type transistor having first, second and third terminals, said first terminal being connected to the output of one of said cells, said second terminal being connected to one of said row selection wires, and said third terminal being connected to one of said column read-out wires;
  - a row selector, operatively connected to said row selection wires, for selecting at least one of said row selection wires by providing a selection signal to the row selection wires; and
  - a monitor output, operatively connected to said column read-out wires, for reading out test signals of said cells arranged in said logic circuit through said switches and said column read-out wires.

19. A semiconductor integrated circuit as claimed in claim 18, wherein said row selector comprises driver means for supplying one of the selection signal and a non-selection signal to said row selection wires.

20. A semiconductor integrated circuit as claimed in claim 18, wherein said monitor output includes a shift register which has a number of bits corresponding to a number of said column read-out wires.

21. A semiconductor integrated circuit as claimed in claim 18, wherein said row selector provides a non-selection signal to all of said row selection wires during an ordinary operation period.

22. A semiconductor integrated circuit having a logic circuit, comprising:
- a plurality of cells, each having a cell input terminal, a cell output terminal and including a circuit element;
- wiring connecting the cell input and output terminals of selected ones of said cells to form said logic circuit, said logic circuit including a plurality of test points arranged in a matrix having rows and columns; and
- a test circuit comprising:
  - a plurality of row selection wires provided in the row direction and formed discretely from said wiring;
  - a plurality of column read-out wires provided in the column direction and being formed discretely from said wiring;
  - a plurality of switches provided within an area where said cells are arranged, for connecting one of said test points to one of said column read-out wires in response to a selection of the corresponding row selection wire, each of said switches having first, second and third terminals, said first terminal being connected to said logic circuit at one of said test points, said second terminal being connected to one of said row selection wires, and said third terminal being connected to one of said column read-out wires;
  - a row selector, operatively connected to said row selection wires, for selecting at least one of said row selection wires; and
  - monitor output means, operatively connected to said column read-out wires, for reading out test signals of said test points arranged in said logic circuit through said switches and said column read-out wires.

23. A semiconductor integrated circuit as claimed in claim 22, wherein said row selector comprises driver means for supplying one of the selection signal and a non-selection signal to said row selection wires.

24. A semiconductor integrated circuit as claimed in claim 22, wherein said monitor output includes a shift register which has a number of bits corresponding to a number of said column read-out wires.

25. A semiconductor integrated circuit as claimed in claim 22, wherein said row selector provides a non-selection signal to all of said row selection wires during an ordinary operation period.

26. A semiconductor integrated circuit as claimed in claim 22, wherein said row selector provides a selection signal to one of said row selection wires during a test mode.

27. A method for testing a semiconductor integrated circuit, the semiconductor integrated circuit including:
  a plurality of cells, each having a cell input terminal, a cell output terminal and a circuit element;
  wiring connecting the cell output terminal of a first one of the cells to the cell input terminal of a second one of the cells so as to form a logic circuit, the logic circuit including a plurality of test points arranged in a matrix having rows and columns; and
  a test circuit including:
    a plurality of row selection wires provided in the row direction and formed discretely from the wiring;
    a plurality of column read-out wires provided in the column direction and formed discretely from the wiring;
    a plurality of switches provided within an area where said cells are arranged for connecting one of the test points to one of the column read-out wires in response to a selection of the corresponding row selection wire, each of the switches having first, second, and third terminals, the first terminal being connected to the logic circuit at one of the test points, the second terminal being connected to one of the row selection wires, and the third terminal being connected to one of the column read-out wires, said method comprising the steps of:
      (a) selecting at least one of the row selection wires by supplying a selection signal to the selected row selection wire so as to place the switches connected to the selected row selection wire in an ON-state; and
      (b) detecting test signals at one of said test points by monitoring said column read-out wires connected to the ON-state switches.

28. A method for testing a semiconductor integrated circuit as claimed in claim 27, wherein said selecting step includes a step of sequentially selecting the row selection wires so that the logic levels of test points along one of the column read-out wires are sequentially monitored.

29. A method for testing a semiconductor integrated circuit as claimed in claim 27, wherein said detecting step includes a step of sequentially monitoring the column read-out wires connected to the switches which are in the ON-state.

30. A method for testing a semiconductor integrated circuit as claimed in claim 27, wherein said detecting step is performed during the logic circuit operation so that the logic level of the predetermined point of the logic circuit is monitored in real time.

31. A method as set forth in claim 27, further comprising the step of providing a non-selection signal to all of the row selection wires during an ordinary operation period.

32. A semiconductor integrated circuit having a test mode, comprising:
  a plurality of cells arranged in a matrix having rows and columns, each of said cells having an input terminal and an output terminal;
  wiring connecting the cell input and output terminals of selected ones of said cells to form a logic circuit; and
  a test circuit including:
    a plurality of row selection wires provided in the row direction along the matrix, said row selection wires being formed discretely from said wiring;
    a plurality of column read-out wires provided in the column direction along said matrix, said column read-out wires being formed discretely from said wiring;
    a plurality of switches, provided at intersections of said row selection wires and said column read-out wires and within an area where said cells are arranged, each of said switches having a first terminal connected to the cell output terminal of a corresponding one of said cells, a second terminal connected to a corresponding one of said row selection wires, and a third terminal connected to a corresponding one of said column read-out wires;
    a row selector, operatively connected to said row selection wires, for selecting at least one of said row selection wires during the test mode of said semiconductor integrated circuit; and
    a monitor output, coupled to said column read-out wires, for providing test signals on the output terminal of said cells in said logic circuit through said switches and said column read-out wires during the test mode of said semiconductor integrated circuit.

33. A circuit testing system comprising:
  a semiconductor integrated circuit including:
    a plurality of cells, each having a cell input terminal and a cell output terminal and including a circuit element coupled to the cell input and output terminals;
    wiring connecting the cell input and output terminals of selected ones of said cells to form a logic circuit, said logic circuit including a plurality of test points arranged in a matrix having rows and columns; and
    a test circuit comprising:
      a plurality of row selection wires provided in the row direction and formed discretely from said wiring;
      a plurality of column read-out wires provided in the column direction and formed discretely from said wiring;
      a plurality of switches provided within an area where said cells are arranged, each of said switches connecting one of said test points to one of said column read-out wires in response to a selection of the corresponding row selection wire, each of said switches having first, second and third terminals, said first terminal being connected to said logic circuit at one of said test points, said second terminal being connected to one of said row selection wires, and said third terminal being connected to one of said column read-out wires;
  a row selector, operatively connected to said row selection wires, for selecting at least one of said row selection wires; and
  a monitor output, operatively connected to said column read-out wires, for reading out test signals of said test points arranged in said logic circuit through said switches and said column read-out wires.

34. A process for manufacturing a semiconductor device, comprising the steps of:
  (a) forming a semiconductor integrated circuit having a plurality of cells, each of the cells having a cell input terminal and a cell output terminal;
  (b) connecting selected ones of the cell input and output terminals of the cells with wiring to form a logic circuit, said logic circuit including a plurality of test points arranged along rows and columns;
  (c) forming a plurality of row selection wires in the row direction, the row selection wires being discrete from the wiring;

(d) forming a plurality of column read-out wires in the column direction, the column read-out wires being discrete from the wiring;

(e) forming a plurality of switches within an area where the cells are arranged, each of the switches having a first terminal connected to the logic circuit at one of the test points, a second terminal connected to a corresponding one of the row selection wires, and a third terminal connected to a corresponding one of the column read-out wires;

(f) selecting at least one of the row selection wires by supplying a selection signal to the selected row selection wire so as to place the switches connected to the selected row selection wire in a first state; and (g) detecting test signals at the cell output terminals of selected ones of said cells by monitoring the column read-out wires connected to the switches which are in the first state.

* * * * *

UNITED STATES PATENT AND TRADEMARK OFFICE
CERTIFICATE OF CORRECTION

PATENT NO. : 5,764,654
DATED : June 9, 1998
INVENTOR(S) : Osam OHBA et al.

It is certified that error appears in the above-identified patent and that said Letters Patent is hereby corrected as shown below:

Title Page, Abstract, line 3, delete ";".

Page 2 of the Title Page, Col. 1, line 5, change "987" to --1987--.

Col. 1, line 41, delete ";".

Col. 7, line 66, change "an" to --a--.

Signed and Sealed this

Seventeenth Day of November, 1998

Attest:

BRUCE LEHMAN

Attesting Officer

Commissioner of Patents and Trademarks